US010658270B2

(12) United States Patent
Lin

(10) Patent No.: US 10,658,270 B2
(45) Date of Patent: May 19, 2020

(54) SEMICONDUCTOR STRUCTURE AND METHOD MAKING THE SAME

(71) Applicant: Taiwan Semiconductor Manufacturing Company, Ltd., Hsin-Chu (TW)

(72) Inventor: Hsiang-Wei Lin, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/460,799

(22) Filed: Jul. 2, 2019

(65) Prior Publication Data

US 2019/0326200 A1    Oct. 24, 2019

Related U.S. Application Data

(60) Continuation of application No. 15/463,988, filed on Mar. 20, 2017, now Pat. No. 10,403,563, which is a
(Continued)

(51) Int. Cl.
*H01L 23/485*   (2006.01)
*H01L 23/522*   (2006.01)
(Continued)

(52) U.S. Cl.
CPC ......... *H01L 23/485* (2013.01); *H01L 21/743* (2013.01); *H01L 21/76802* (2013.01);
(Continued)

(58) Field of Classification Search
CPC ............. H01L 21/743; H01L 21/76802; H01L 21/76814; H01L 21/76831; H01L 21/76832; H01L 21/76834; H01L 23/5226
See application file for complete search history.

(56) References Cited

U.S. PATENT DOCUMENTS 6,303,486 B1    10/2001  Park
6,403,484 B1    6/2002   Lim
(Continued)

FOREIGN PATENT DOCUMENTS

WO    WO2004/049432    6/2004

OTHER PUBLICATIONS

JIPO, Office Action, U.S. Appl. No. 14/222,295, dated Mar. 21, 2014, 6 pages, No translation.
(Continued)

*Primary Examiner* — Joseph M Galvin, III
(74) *Attorney, Agent, or Firm* — Haynes and Boone, LLP

(57) ABSTRACT

A semiconductor structure includes a semiconductor substrate and a conductive feature formed over the semiconductor substrate, an etch stop layer formed over the conductive feature, a dielectric layer formed over the etch stop layer, and a contact formed in a contact trench within the dielectric layer. The bottom of the contact is disposed over a top surface of the conductive feature. The semiconductor structure further includes a self-aligned sealing oxide layer formed on the dielectric layer. The self-aligned sealing oxide layer directly contacts the dielectric layer from a bottom-most portion of the self-aligned sealing oxide layer to a top-most portion of the self-aligned sealing oxide layer.

20 Claims, 8 Drawing Sheets

Related U.S. Application Data division of application No. 14/222,295, filed on Mar. 21, 2014, now Pat. No. 9,613,852.

(51) Int. Cl.
  *H01L 21/74* (2006.01)
  *H01L 21/768* (2006.01)
  *H01L 23/528* (2006.01)
  *H01L 23/532* (2006.01)

(52) U.S. Cl.
  CPC .. *H01L 21/76814* (2013.01); *H01L 21/76831* (2013.01); *H01L 21/76832* (2013.01); *H01L 21/76834* (2013.01); *H01L 21/76843* (2013.01); *H01L 21/76885* (2013.01); *H01L 23/528* (2013.01); *H01L 23/5226* (2013.01); *H01L 23/5329* (2013.01); H01L 2924/0002 (2013.01)

(56) References Cited

U.S. PATENT DOCUMENTS

| | | |
|---|---|---|
| 2003/0008511 A1 | 1/2003 | Tsai et al. |
| 2003/0143839 A1* | 7/2003 | Raaijmakers ..... H01L 21/28556 438/633 |
| 2005/0006776 A1* | 1/2005 | Lin .................. H01L 21/76831 257/762 |
| 2006/0133129 A1* | 6/2006 | Rodriguez .............. G11C 11/22 365/145 |
| 2007/0048954 A1 | 3/2007 | Kato et al. |
| 2007/0202676 A1* | 8/2007 | Yeh .................. H01L 21/02063 438/597 |
| 2010/0078821 A1* | 4/2010 | Kahlert ............. H01L 21/76814 257/758 |
| 2010/0176472 A1 | 7/2010 | Shoji |
| 2012/0238774 A1* | 9/2012 | Hayashi .............. H01L 51/0035 560/86 |
| 2014/0273496 A1 | 9/2014 | Kao et al. |
| 2015/0311114 A1 | 10/2015 | Huang et al. |

OTHER PUBLICATIONS

U.S. Appl. No. 14/261,367, filed Apr. 24, 2014, by inventors Julia Huang and Hsiang-Wei Lin, for "Semiconductor Structure and Method of Making the Same," 19 pages of text, 6 pages of drawings.

* cited by examiner

US 10,658,270 B2

SEMICONDUCTOR STRUCTURE AND METHOD MAKING THE SAME

PRIORITY INFORMATION

This application is a continuation of U.S. application Ser. No. 15/463,988 filed Mar. 20, 2017, and entitled "Semiconductor Structure and Method Making the Same," which is a divisional of U.S. patent application Ser. No. 14/222,295 filed Mar. 21, 2014, and entitled "Semiconductor Structure and Method for Making the Same," the disclosure of which is hereby incorporated by reference in the entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices. CMOS devices have typically been formed with conductive features, etch stop layers, sealing layers, and/or barrier layers. There has been a desire to reduce resistance and improve device performance as feature sizes continue to decrease. Accordingly, it is desirable to have improved method and structure for the sealing layer in a semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
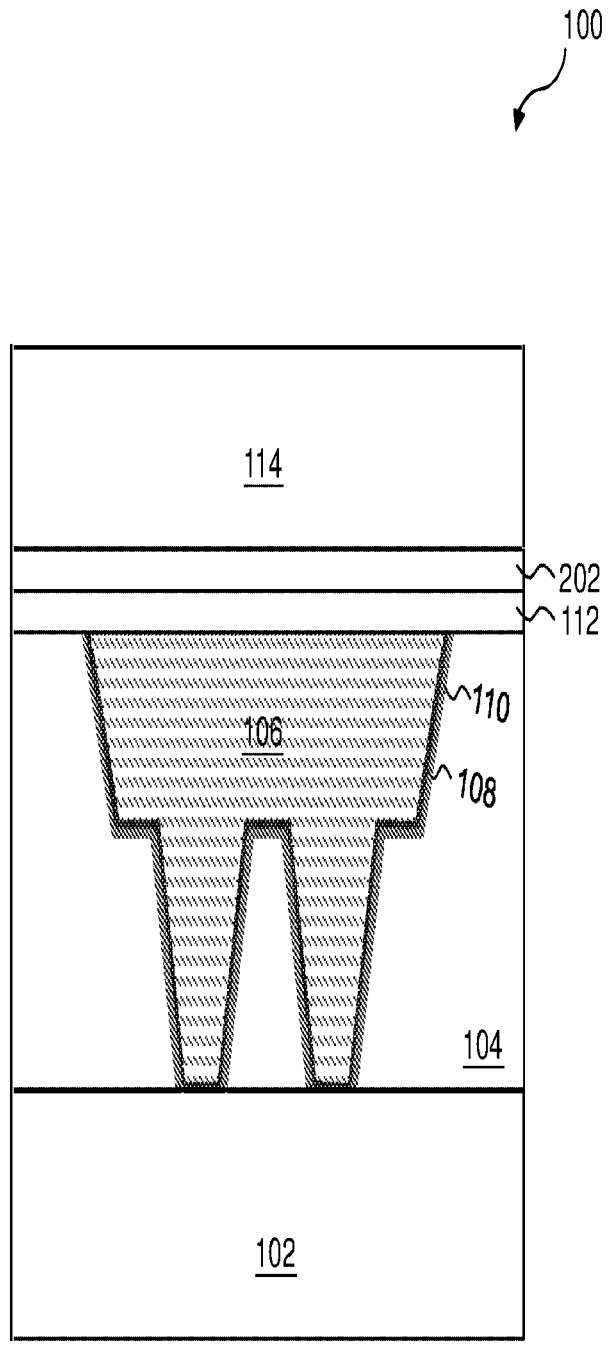
FIGS. 1-5 are diagrammatic sectional side views illustrating a semiconductor structure including a sealing layer at various fabrication steps, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-5 are diagrammatic sectional side views illustrating a semiconductor structure 100 including a sealing oxide layer 120 at various fabrication steps according to some embodiments of the present disclosure. It should be noted that the semiconductor structure 100 may be formed as part of a semiconductor device. The semiconductor structure 100 may also be fabricated with a CMOS process flow.

Referring to FIG. 1, a semiconductor structure 100 is provided. In some embodiments, the semiconductor structure 100 includes a substrate 102, a first low-k dielectric layer 104 disposed on the substrate 102, a first etch stop layer (ESL) 112 formed on the first dielectric layer 104, a second ESL 202 formed on the first ESL 112, and a second low-k dielectric layer 114 formed on the second ESL 202. In some embodiments as shown in FIG. 1, a conductive feature 106 is formed in the first low-k dielectric layer 104. In some embodiments, one or more layers, e.g., a sealing layer 108, and/or a barrier layer 110, may be formed along the sidewalls of the conductive feature 106.

In some embodiments, the substrate 102 may be a silicon wafer. The substrate 102 may also include another elementary semiconductor, such as germanium; a compound semiconductor including silicon carbide, gallium arsenic, gallium phosphide, indium phosphide, indium arsenide, and/or indium antimonide; or an alloy semiconductor including SiGe, GaAsP, AlInAs, AlGaAs, GaInAs, GaInP, and/or GaInAsP. In some alternative embodiments, the substrate 102 includes a semiconductor on insulator (SOI). In some embodiments, a dielectric layer may be formed over the substrate 102. In some embodiments, the dielectric layer may include silicon oxide. In some embodiments, the dielectric layer may additionally or alternatively include silicon nitride, silicon oxynitride, or other suitable dielectric material.

The substrate 102 may also include various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate 102 may further include other functional features such as a resistor or a capacitor formed in and on the substrate. In some embodiments, the substrate 102 may further include lateral isolation features provided to separate various devices formed in the substrate 102. The isolation features may include shallow trench isolation (STI) features to define and electrically isolate the functional features. In some examples, the isolation regions may include silicon oxide, silicon nitride, silicon oxynitride, an air gap, other suitable materials, or combinations thereof. The isolation regions may be formed by any suitable process. The substrate 102 may further include other features, such as silicide disposed on S/D and gate stacks overlying channels.

Referring to FIG. 1, the first low-k dielectric layer 104 may be an interlayer dielectric (ILD) layer. In some embodiments, the first low-k dielectric layer 104 may include silicon oxide, fluoride-doped silicate glass (FSG), a low-k dielectric material, and/or other suitable insulating material. In some embodiments, the first low-k dielectric layer 104 may include a single layer or multiple layers. In some embodiments, the first low-k dielectric layer 104 may be formed using a suitable technique, such as chemical vapor deposition (CVD), atomic layer deposition (ALD), and spin-on technique.

Still referring to FIG. 1, the conductive feature 106 may include a metal contact, a metal via, or a metal line. In some alternative embodiments, the conductive feature 106 includes an electrode of a capacitor, a resistor or a portion of a resistor. In some embodiments, the conductive feature 106 may include copper (Cu), aluminum (Al), tungsten (W), any suitable material, or combinations thereof. In some embodiments as shown in FIG. 1, the one or more layers formed along the sidewalls of the conductive feature 106, e.g., the sealing layer 108 and/or the barrier layer 110, are formed to prevent diffusion and/or provide material adhesion. In some embodiments, the sealing layer 108 may include an oxide layer or a nitride layer. In some embodiments, the barrier layer 110 may include one or more materials selected from the group consisting of aluminum (Al), copper (Cu), titanium (Ti), tungsten (W), titanium nitride (TiN), tantalum nitride (TaN), tungsten nitride (WN), titanium silicon nitride (TiSiN), tantalum silicon nitride (TaSiN), and combinations thereof. The barrier layer 110 may also include one or more metallic materials that are electrically conductive but do not permit inter-diffusion and reactions between the first low-k dielectric layer 104 and the conductive feature 106. The barrier layer 110 may include refractory metals and their nitrides.

In some embodiments, the conductive feature 106, the sealing layer 108, and the barrier layer 110 may be formed by a procedure including lithography, etching and deposition. For example, first low-k dielectric layer 104 may be patterned using a photolithograph process. One or more etching processes, e.g., drying etching process, wet etching process, or combinations thereof, may be performed to form contact trenches. The conductive feature 106, the sealing layer 108, and the barrier layer 110 may then be deposited by physical vapor deposition (PVD), chemical vapor deposition (CVD), metal-organic chemical vapor deposition (MOCVD), and atomic layer deposition (ALD), other suitable technique, or combinations thereof. A CMP process may be used to form a coplanar surface of the low-k dielectric layer 104 and the conductive feature 106.

Still referring to FIG. 1, the first ESL 112 is formed on the coplanar surface of the low-dielectric layer 104 and the conductive feature 106. In some embodiments, the first ESL 112 is an aluminum (Al) containing ESL 112. In some embodiments, the first ESL 112 includes one or more elements selected from the group consisting of Al, oxygen (O), hydrogen (H), carbon (C), boron (B), and nitrogen (N). In some examples, the Al containing ESL 112 includes one or more materials such as aluminum nitride (AlN) and/or aluminum oxynitride (AlON). In some embodiments, the first ESL 112 is a titanium (Ti) containing ESL 112. In some embodiments, the first ESL 112 includes one or more elements selected from the group consisting of Ti, oxygen (O), hydrogen (H), carbon (C), boron (B), and nitrogen (N). In some examples, the Ti containing ESL 112 includes one or more materials such as titanium nitride (TiN) and/or titanium oxynitride (TiON). In some embodiments, the first ESL 112 includes a dielectric material chosen to have suitable etching selectivity for one or more subsequent etching processes to form contact trenches. In some embodiments, the first ESL 112 may be deposited using any suitable technique, such as CVD, PVD, ALD, or an epitaxial growing process. In some embodiments, the thickness of the first ESL 112 is in a range from about 5 Å to about 100 Å.

The second ESL 202 may include one or more elements selected from the group consisting of silicon (Si), carbon (C), nitrogen (N), oxygen (O), hydrogen (H), and combinations thereof. In some embodiments, the second ESL 202 may include silicon nitride ($Si_xN_y$), silicon oxynitride, silicon carbide, and/or other suitable materials. In some embodiments, the second ESL 202 may be deposited using any suitable technique, such as CVD, physical vapor deposition (PVD), ALD, or any suitable deposition method. In some embodiments, the thickness of the second ESL 202 is in a range from about 10 Å to about 500 Å.

Still referring to FIG. 1, a second low-k dielectric layer 114 is formed on the second ESL 202. In some embodiments, the second low-k dielectric layer 114 may be an interlayer dielectric (ILD) layer. In some embodiments, the second low-k dielectric layer 114 may include silicon oxide, fluoride-doped silicate glass (FSG), a low-k dielectric material, and/or other suitable insulating material. In some embodiments, the second low-k dielectric layer 114 may include a single layer or multiple layers. In some embodiments, the second low-k dielectric layer 114 may be formed using a suitable technique, such as chemical vapor deposition (CVD), atomic layer deposition (ALD), and spin-on technique.

Figure 2:
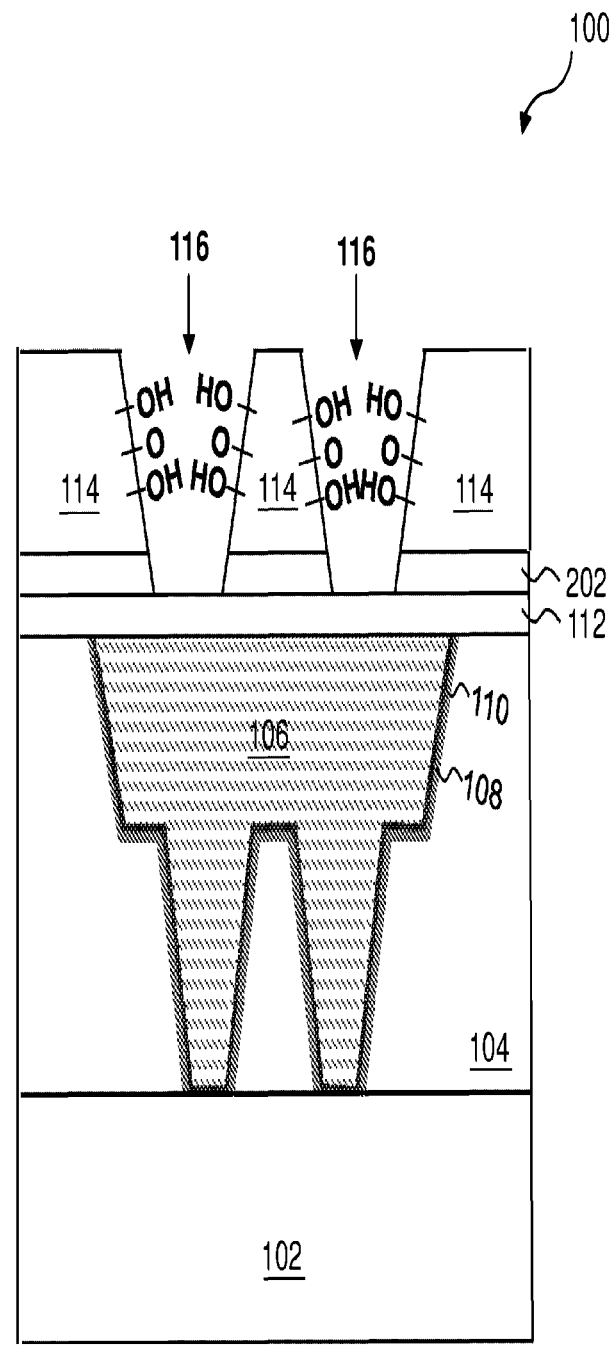

Referring to FIG. 2, one or more contact trenches 116 are formed in the second low-k dielectric layer 114 and are aligned with the conductive feature 106. In some embodiments, the contact trenches 116 may be formed by a lithography process and an etching process including one or more etching steps. The lithography process is used to pattern the low-k dielectric layer 114. The etching process includes a first etch step using a dry etch to selectively remove the second low-k dielectric layer 114 in the contact regions without etching the second ESL 202. In some examples, the dry etch process includes a plasma etch with a suitable etchant, such as a fluorine-containing etchant. For example, the fluorine-containing etchant including difluoromethane ($CH_2F_2$), trifluoromethane ($CHF_3$), and/or fluoromethane ($CH_3F$) may be used to selectively remove the low-k dielectric layer 114 without etching the ESL 112.

The etching process also includes a second etch step used to selectively remove the second ESL 202 in the contact regions using a wet etch with a suitable etchant, such as a hot phosphorous (H$_3$PO$_4$) acid, without etching the first ESL 112 as shown in FIG. 2. In some embodiments, the second etch step is performed using the contact trenches 116 formed in the low-dielectric layer 114 at the first etch step as etching masks to further extend the contact trenches 116 through the second ESL 202. A top surface of the first ESL 112 is exposed in the contact trenches 116 after etching the second ESL 202.

As shown in FIG. 2, in some embodiments, because the low-k dielectric layer 114 includes one or more elements such as silicon (Si), O, C, and H, after etching to form the contact trenches 116, the surface of the contact trenches 116 may include 0-containing bonds, such as —OH and/or —O. In some embodiments, after etching to form the contact trenches 116, the low-k dielectric materials exposed at the surfaces of the contact trenches 116 may absorb water and/or oxygen in the ambient environment, so that dangling bonds such as —OH and/or —O may also be formed at the surfaces of the contact trenches 116.

Figure 3:
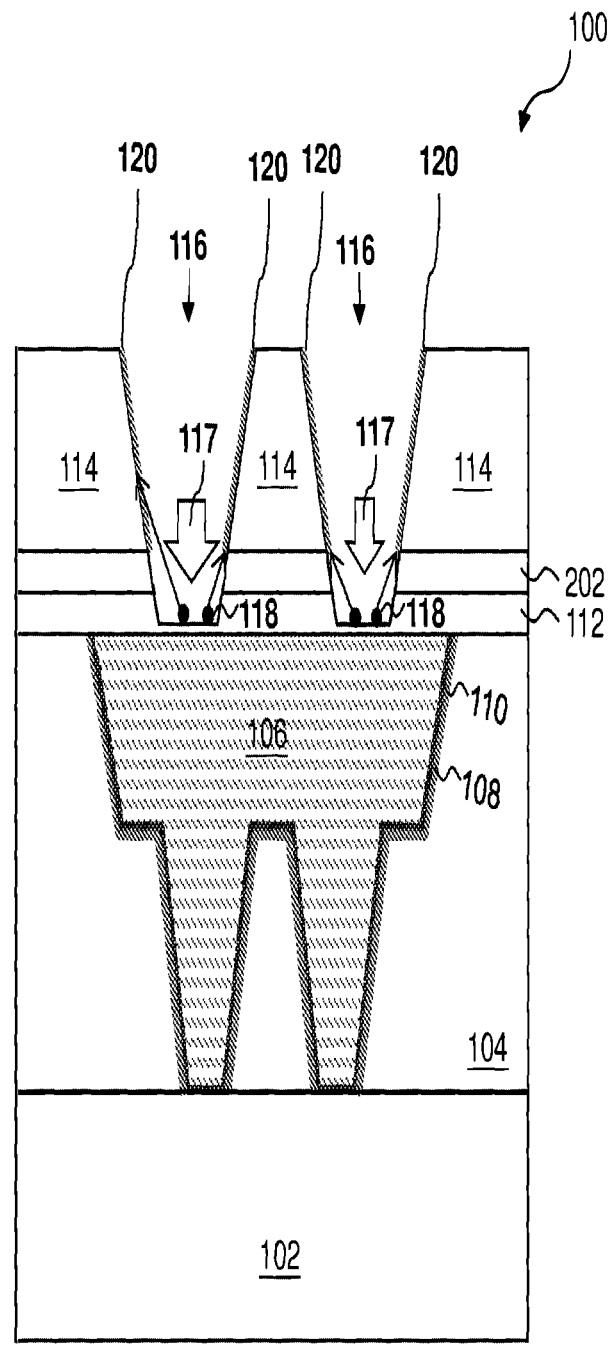

Referring to FIG. 3, a sputtering process 117 is performed to the first ESL 112 to remove the portions of the first ESL 112 exposed in the contact trenches 116. In some embodiments, the sputtering process is performed using a PVD tool including one or more deposition/sputtering chambers. In some embodiments, the sputtering process uses the portions of the first ESL 112 exposed in the contact trenches 116 as targets to induce one or more Al containing radicals 118 or Ti containing radicals 118 to escape from the surface of the Al containing ESL 112 or Ti containing ESL 112 respectively as shown in FIG. 3.

In some embodiments, the sputtering process 117 may be performed using one or more gases such as argon (Ar) gas. In some embodiments, the flow rate of the Ar gas is in a range from about 5 sccm to 100 sccm. The pressure of the chamber for sputtering may be controlled to be in a range from about 10$^{-3}$ mTorr to about 10$^{-6}$ mTorr. The plasma power is in a range from about 10 kW to about 40 kW. During the sputtering process, a bias power in a range from about 100 W to about 2000 W is applied to the substrate of the semiconductor structure 100, so that the charged molecules and ions in the Ar plasma can be used to bombard the exposed portions of the first ESL 112 in the contact trenches 116 as shown in FIG. 3. In some embodiments, the sputtering process may be conducted at a temperature in a range from about 10° C. to about 50° C. The sputtering time may be in a range from about 2 seconds to about 20 seconds.

Still referring to FIG. 3, at the same time with the sputtering process, the Al containing ESL 112 or the Ti containing ESL 112 may be bombarded, and one or more Al containing radicals 118 or Ti containing radicals 118 respectively may move out of the first ESL 112. In some embodiments, the radicals 118 may move to the sidewalls of the contact trenches 116 to combine with the oxygen (O) in the surface bonds —OH and/or —O (e.g., as shown in FIG. 2) to form a sealing oxide layer 120 along the sidewalls of the contact trenches as shown in FIG. 3. Therefore, in some embodiments, the portions of the first ESL 112 exposed in the contact trenches 116 are removed and the sealing oxide layer 120 is formed simultaneously. In some embodiments, the sputtering process 117 is controlled to stop at the conductive feature 106, so that the sputtering process is only performed to the first ESL 112 without damaging the top surface of the conductive feature 106.

Figure 4:
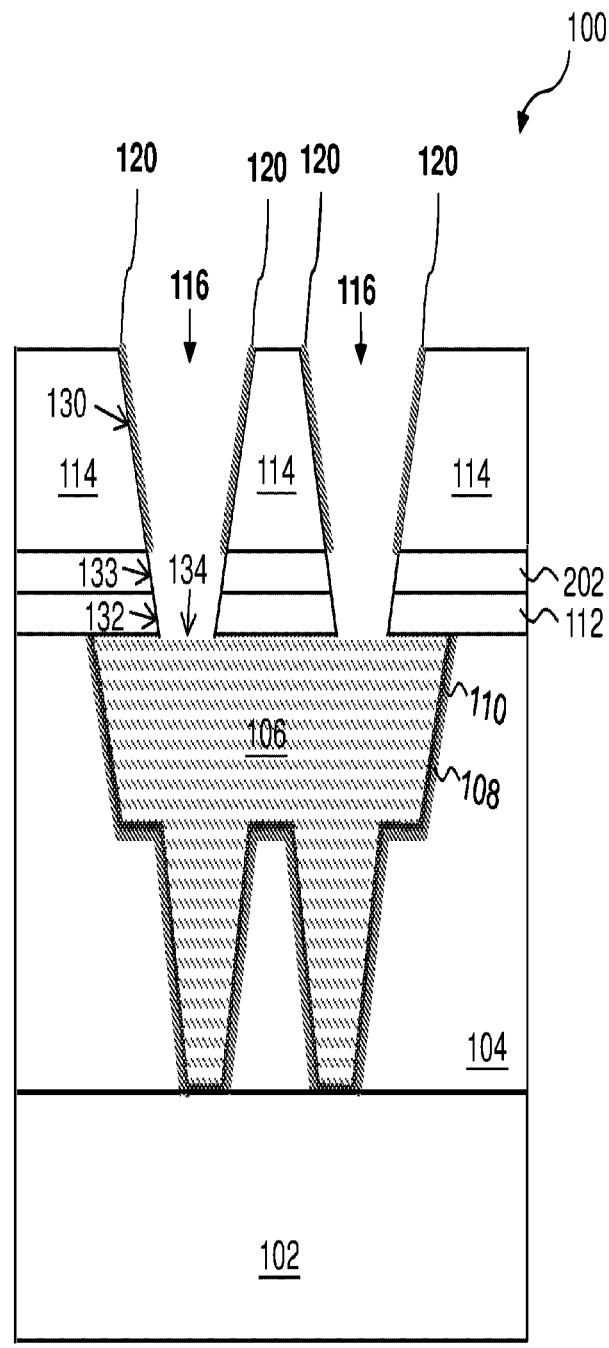

Referring to FIG. 4, after the portions of the first ESL 112 exposed in the contact trenches 116 have been completely removed, the self-aligned sealing oxide layers 120 are selectively formed on the sidewall surfaces of the low-k dielectric layer 114 exposed in the contact trenches 116 (e.g., surface 130). In some embodiments when the first ESL 112 is Al containing ESL 112, the sealing oxide layer 120 includes aluminum oxide. In some embodiments, when the first ESL 112 is Ti containing ESL 112, the sealing oxide layer 120 includes titanium oxide. In some embodiments, the sealing oxide layer 120 has a thickness in a range from about 5 Å to about 50 Å. In some embodiments, the sealing oxide layer 120 has a high density so that it can prevent metal formed in the contact trenches 116 from diffusion.

Still referring to FIG. 4, in some embodiments, because the oxygen containing bonds —OH and/or —O are formed on the sidewall surfaces of the low-k dielectric layer 114 (e.g., surface 130), the sealing oxide layer 120 is a self-aligned sealing layer that is conformed to the sidewall surfaces of the low-k dielectric layer 114 exposed in the contact trenches 116 (e.g., surface 130) as shown in FIG. 4. In some embodiments, the sealing oxide layer 120 may not be formed along the sidewalls of the etched portions of the first ESL 112 (e.g., surface 132) or the second ESL 202 (e.g., surface 133). In some embodiments, the sealing oxide layer 120 is not formed at the bottom of the contact trenches 116 (e.g., surface 134) due to the lack of the oxygen containing bonds at the bottom of the contact trenches. The absence of the sealing oxide layer on the bottom of the contact trenches and between the interlayer conductive features can effectively reduce the contact resistance thus improve the device performance.

Figure 5:
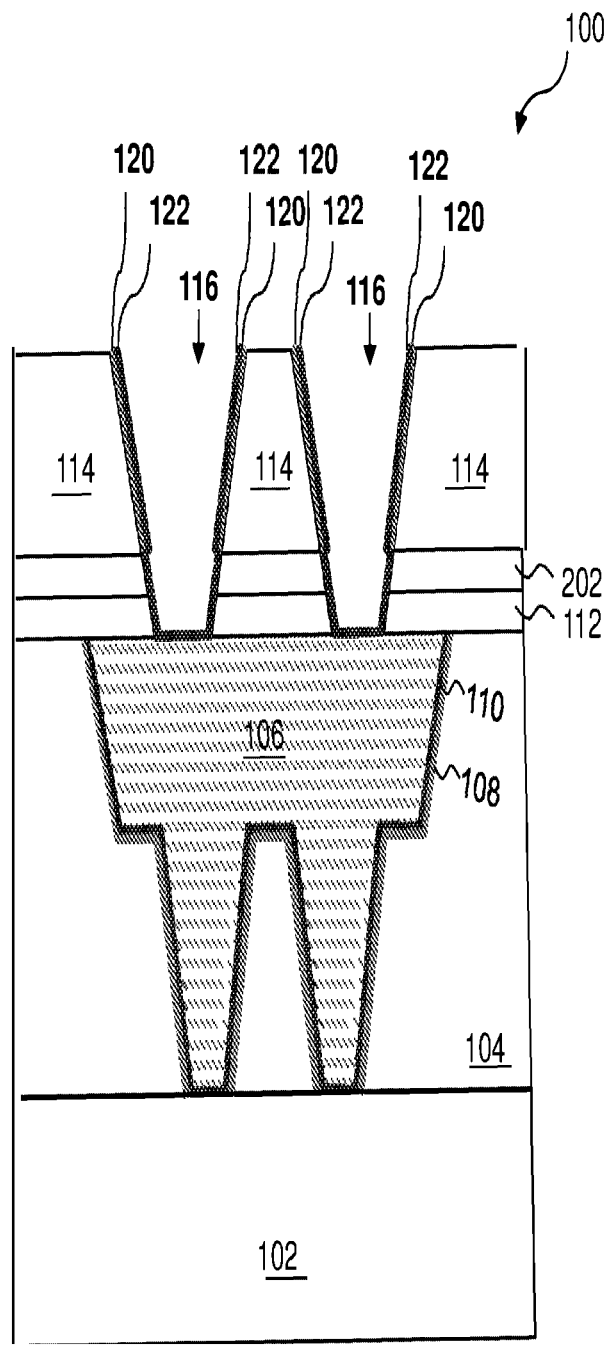

Referring to FIG. 5, after the sputtering process to form the sealing oxide layer 120, a barrier layer 122 is formed on the sealing oxide layer 120 to further prevent metal diffusion and/or provide material adhesion. In some embodiments, the barrier layer 122 is also formed on the exposed portions of the first ESL 112 and second the ESL 202 (e.g., surface 132 and surface 133 of FIG. 4) and the exposed top surface of the conductive feature 106 (e.g., surface 134 of FIG. 4). In some embodiments, the barrier layer 122 may include one or more metallic materials that are electrically conductive but do not permit inter-diffusion and reactions between the second low-k dielectric layer 114 and the conductive feature to be deposited in the contact trenches 116. In some embodiments, the barrier layer 122 includes one or more materials selected from the group consisting of aluminum (Al), copper (Cu), titanium (Ti), tungsten (W), titanium nitride (TiN), tantalum nitride (TaN), tungsten nitride (WN), titanium silicon nitride (TiSiN), tantalum silicon nitride (TaSiN), and combinations thereof. In some embodiments, the barrier layer 122 has a thickness in a range from about 10 Å to about 100 Å. In some embodiments, the barrier layer 122 may be formed using the same PVD tool that is used for the sputtering process 117. In some embodiments of the present disclosure, the barrier layer 122 is optional, as the self-aligned sealing oxide layer 120 may provide sufficient prevention of the material diffusion between the conductive feature to be filled in contact trenches 116 and the low-k dielectric layer 114.

Figure 6:
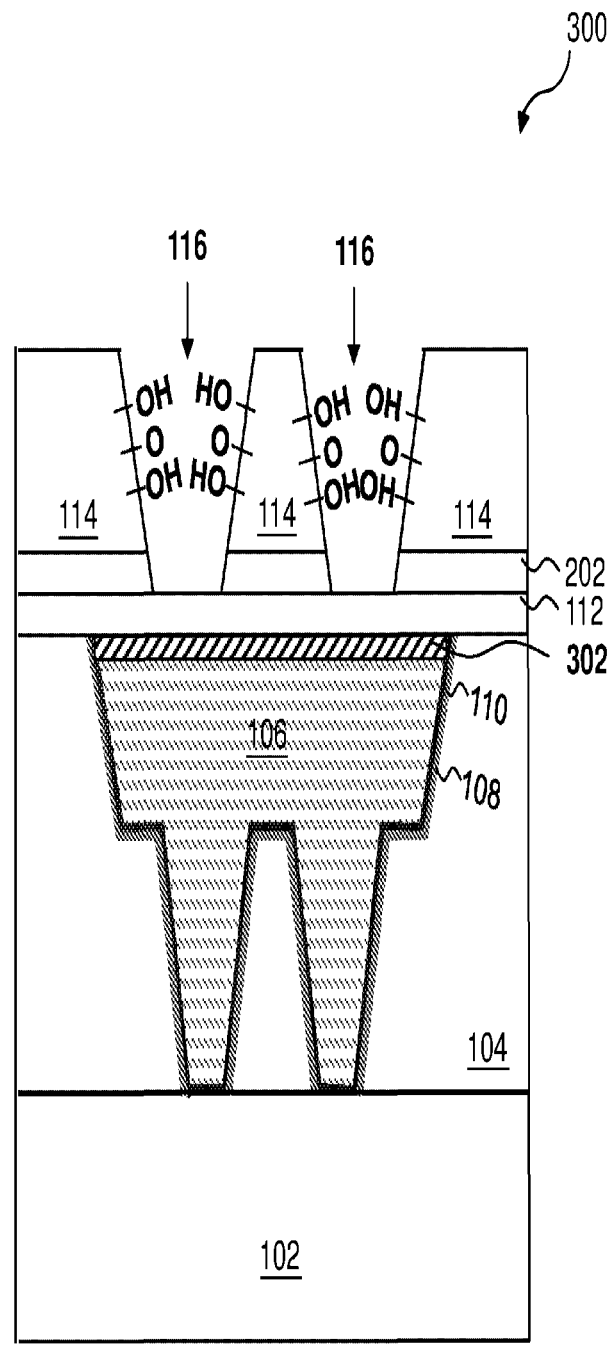
FIGS. 6-7 are diagrammatic sectional side views illustrating a semiconductor structure including a sealing layer and a cap layer at various fabrication steps, in accordance with some embodiments.
Figure 7:
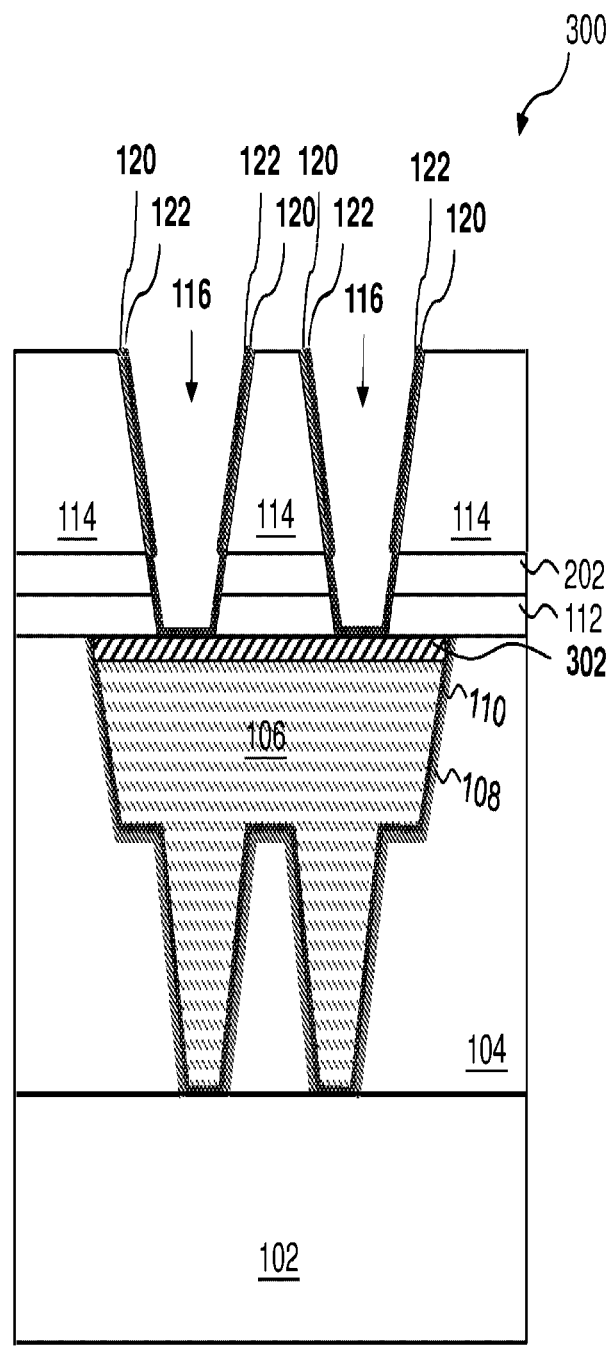

FIGS. 6-7 are diagrammatic sectional side views illustrating a semiconductor structure 300 including a sealing oxide layer 120 and a cap layer 302 at various fabrication steps according to some embodiments. The other material layers and the fabrication processes of the semiconductor structure 300 are substantially similar to those of the semiconductor structure 100. It is to be understood that the semiconductor 300 is an alternative embodiment of the semiconductor 100 as the cap layer 302 is optional in the present disclosure.

In some embodiments, the cap layer 302 includes a cobalt (Co) cap layer. In some alternative embodiments, the cap layer 302 includes at least one layer of manganese (Mn), nickel (Ni), ruthenium (Ru), titanium (Ti) and/or combinations thereof. In some embodiments, the cap layer 302 may be deposited using any suitable technique, such as CVD or ALD. In some embodiments, the thickness of the cap layer 302 is in a range from about 0 Å to about 100 Å. In some embodiments as shown in FIGS. 6-7, the cap layer 302 is selectively grown on the conductive feature 106 for capping the conductive feature 106. Therefore, the cap layer 302 is self-aligned with the conductive feature 106. The cap layer 302 may effectively reduce the contact resistance and avoid the electromigration between different layers of interconnect structures. The cap layer 302 may also provide a good intrinsic adhesion between the conductive feature 106 and the subsequent layers formed on the conductive feature, such as first ESL 112, so that the material integration of the semiconductor structure can be improved.

Referring to FIG. 7, when the sputtering process 117 is performed to the first ESL 112, the portions of the first ESL 112 exposed in the contact trenches 116 are removed and the sealing oxide layer 120 is formed simultaneously with the sputtering process. In some embodiments, the sputtering process 117 is controlled to stop at the cap layer 302, so that the sputtering process is only performed to the first ESL 112 without damaging the top surface of the cap layer 302. A barrier layer 122 is further formed on the sealing oxide layer 120, the exposed portions of the first ESL 112 and the exposed portions of the second ESL 202, and the exposed top surface of the cap layer 302, as shown in FIG. 7. In some embodiments, the formation, material compositions, and the thickness of the sealing oxide layer 120 and the barrier layer 122 in semiconductor structure 300 are substantially similar to those of the semiconductor structure 100 as described with regard to FIG. 5.

Figure 8:
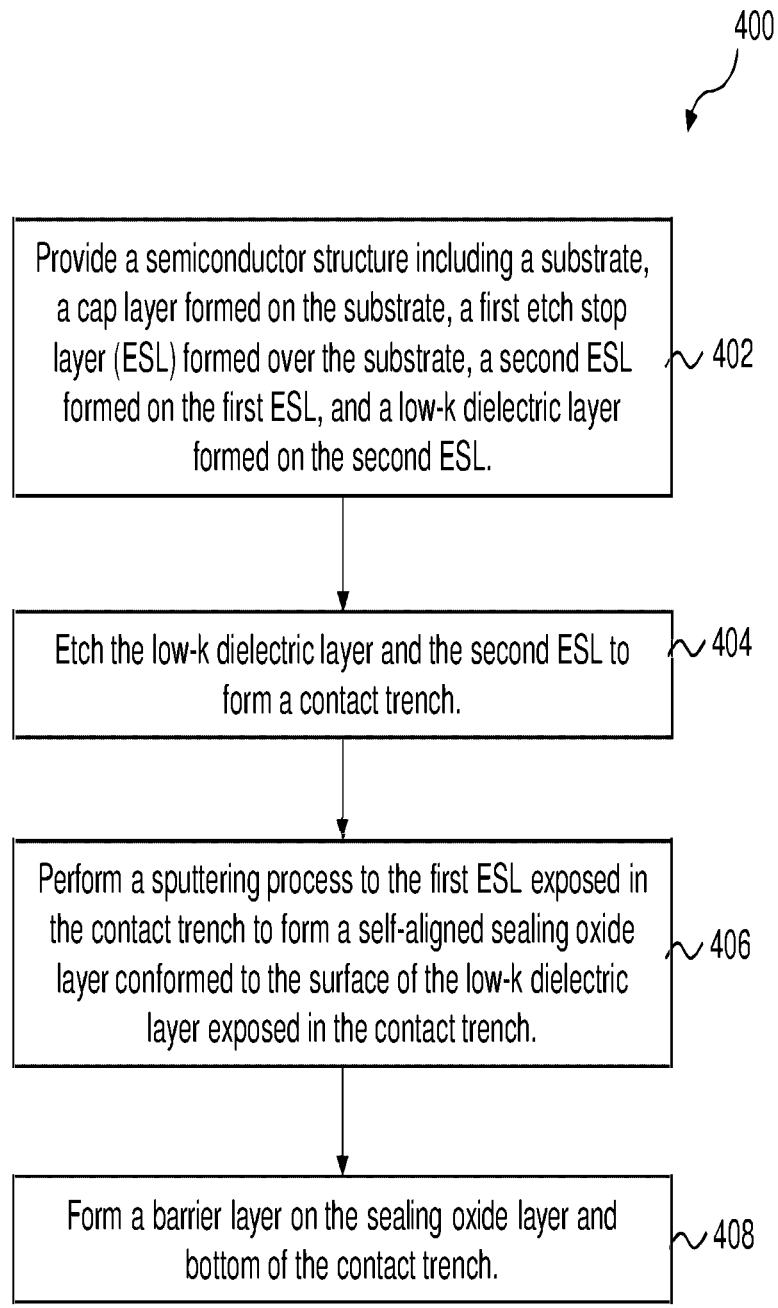
FIG. 8 is a flow chart showing an illustrative method for forming a semiconductor structure including a sealing oxide layer, in accordance with some embodiments.

FIG. 8 is a flow chart showing an illustrative method 400 for forming the semiconductor structures 100, and/or 300 including the sealing oxide layer 120 according to some embodiments of the present disclosure. Method 400 includes a process 402 for providing a semiconductor structure, a process 404 for etching the low-k dielectric layer to form a contact trench, a process 406 for performing a sputtering process to the etch stop layer (ESL) to form a self-aligned sealing oxide layer simultaneously, and a process 408 for forming a barrier layer on the sealing oxide layer. It should be understood that additional processes may be provided before, during, and after the method 400 of FIG. 8, and that some other processes may be briefly described herein.

At process 402, a semiconductor structure (semiconductor structure 100, or 300 of the present disclosure) is provided. In some embodiments, the semiconductor structure includes a substrate 102, a conductive feature 106 formed over the substrate, a first ESL 112 formed on the conductive feature 106, a second ESL 202 formed on the first ESL 112, and a low-k dielectric layer 114 formed on the second ESL 202. In some embodiments, the semiconductor structure may include a cap layer 302 formed self-aligned with the conductive feature 106. e.g., the cap layer 302 of the semiconductor structure 300.

At process 404, the low-k dielectric layer 114 is etched to form one or more contact trenches 116. In some embodiments, the contact trenches 116 may be formed using more than one etch step. For example, the etch process includes a first dry etch step to remove the low-k dielectric layer 114 in the contact regions, and a second wet etch step to remove the second ESL 202 in the contact regions. The dry etch may be selectively performed to the low-k dielectric layer 114 without etching the second ESL 202. The wet etch may be selectively performed to the second ESL 202 without etching the first ESL 112.

At process 406, a sputtering process is performed to the first ESL 112 exposed in the contact trenches 116 and a sealing oxide layer 120 is formed on the exposed surface of the low-k dielectric layer 114 in the contact trenches simultaneously with the sputtering process. In some embodiments, the sealing oxide layer 120 is a self-aligned layer conformed only to the sidewall surfaces of the low-k dielectric layer 114 (e.g., surface 130 of FIG. 4). In some embodiments, the sealing oxide layer 120 is formed by an oxidation of the Al containing radicals 118 or Ti containing radicals 118, by the oxygen from the O-containing bonds, such as —OH and/or —O at the surface of the low-k dielectric layer 114. In some embodiments, the sputtering process uses the portions of the first ESL 112 exposed in the contact trenches 116 as targets to induce one or more Al containing radicals 118 or Ti containing radicals 118 to escape from the surface of the Al containing ESL 112 or Ti containing ESL 112 as shown in FIG. 3. The sputtering process can be controlled to stop at the surface of the conductive feature 106. When there is a self-aligned cap layer 302, the sputter process can be controlled to stop at the surface of the cap layer 302.

At process 408, a barrier layer 122 is further formed on the sealing oxide layer 120, the exposed portions of the first ESL 112, the exposed portions of the second ESL 202, and the exposed top surface of the conductive feature 106 as shown in FIG. 5. In some embodiments when there is a self-aligned cap layer 302 formed on the conductive feature 106, the barrier layer 122 is formed on the top surface of the cap layer 302 as shown in FIG. 7.

Although not shown, it is to be understood that one or more subsequent processes are performed for the fabrication of the semiconductor device. In some examples, the method further includes depositing a metal layer on the barrier layer to fill the contact trenches; and performing a chemical mechanical polishing (CMP) process to form a contact metal in the trench. The contact metal and the dielectric layer are coplanar after the CMP process.

The present embodiments describe mechanisms for forming a sealing oxide layer in a semiconductor device. The mechanisms involve forming contact trenches in the low-k dielectric layer, and performing a sputtering process to the etch stop layer (ESL) exposed in the contact trenches to form the sealing oxide layer simultaneously. The mechanisms provide a sputtering process for removing the ESL and forming the self-aligned sealing oxide layer simultaneously. The sputtering process can be performed using a PVD tool that can also be used for deposition of other material layers, such as the barrier layer. The sputtering process also eliminates the needs for special gases, because the oxygen needed for forming the sealing oxide layer can be provided by the low-k dielectric layer and/or from the etching process in the ambient atmosphere. The mechanisms also provides a self-aligned sealing oxide layer with a thin and dense structure that is not formed between the interlayer conductive features, so that the sealing oxide layer can effectively prevent the metal diffusion as well as can reduce the contact resistance to provide an improved device performance.

The present disclosure provides a method for forming a semiconductor structure. In accordance with some embodiments, the method includes providing a substrate and a conductive feature formed over the substrate; forming a first etch stop layer over the conductive feature; forming a low-k dielectric layer over the first etch stop layer; etching the low-k dielectric layer to form a contact trench aligned with the conductive feature; performing a sputtering process to the first etch stop layer exposed in the contact trench; and forming a sealing oxide layer on sidewall surfaces of the low-k dielectric layer. In some embodiments, the sealing oxide layer is self-aligned and conformed to the sidewall surfaces of the low-k dielectric layer exposed in the contact trench.

The present disclosure provides a method for forming a semiconductor structure. In accordance with some embodiments, the method includes providing a substrate and a conductive feature formed over the substrate; forming a first etch stop layer over the conductive feature; forming a second etch stop layer over the first etch stop layer; forming a low-k dielectric layer on the second etch stop layer; etching the low-k dielectric layer to form a contact trench aligned with the conductive feature in the low-k dielectric layer; etching the second etch stop layer using the contact trench in the low-k dielectric layer as an etching mask to extend the contact trench through the second etch stop layer to expose a top surface of the first etch stop layer; and performing a sputtering process to the first etch stop layer exposed in the contact trench thereby forming a sealing oxide layer. In some embodiments, the sealing oxide layer is formed by oxidation of metal radicals from the low-k dielectric layer by oxygen containing bonds on sidewall surfaces of the low-k dielectric layer. In some embodiments, the sealing oxide layer is self-aligned and conformed to the sidewall surfaces of the low-k dielectric layer exposed in the contact trench.

The present disclosure provides a semiconductor structure. In accordance with some embodiments, the structure includes a semiconductor substrate and a conductive feature formed over the substrate; an etch stop layer formed over the conductive feature; a low-k dielectric layer formed over the etch stop layer; a contact trench formed in the low-k dielectric layer, a bottom of the contact trench being disposed over a top surface of the conductive feature; and a self-aligned sealing oxide layer formed on the low-k dielectric layer. In some embodiments, the self-aligned sealing oxide layer is conformed to surfaces of the low-k dielectric layer exposed in the contact trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a semiconductor substrate and a conductive feature formed over the semiconductor substrate;
   an etch stop layer formed over the conductive feature;
   a dielectric layer formed over the etch stop layer;
   a contact formed in a contact trench within the dielectric layer, a bottom of the contact being disposed over a top surface of the conductive feature; and
   a self-aligned sealing oxide layer formed on the dielectric layer,
   wherein the self-aligned sealing oxide layer directly contacts the dielectric layer from a bottom-most portion of the self-aligned sealing oxide layer to a top-most portion of the self-aligned sealing oxide layer.

2. The semiconductor structure of claim 1, further comprising:
   a barrier layer formed over the self-aligned sealing oxide layer,
   wherein the barrier layer is conformed to the self-aligned sealing oxide layer and the bottom of the contact trench.

3. The semiconductor structure of claim 1, wherein the self-aligned sealing oxide layer is in direct contact with the dielectric layer.

4. The semiconductor structure of claim 1, wherein the etch stop layer includes an aluminum containing layer; and
   wherein the self-aligned sealing oxide layer includes aluminum oxide.

5. The semiconductor structure of claim 1, wherein the etch stop layer includes a titanium containing layer; and
   wherein the self-aligned sealing oxide layer includes titanium oxide.

6. A semiconductor structure comprising:
   a substrate;
   a conductive feature disposed over the substrate;
   a first etch stop layer over the conductive feature;
   a dielectric layer over the first etch stop layer;
   a contact formed within a contact trench within the dielectric layer and aligned with the conductive feature; and
   a sealing oxide layer on sidewall surfaces of the contact trench, wherein the sealing oxide layer directly contacts the dielectric layer from a bottom-most portion of the self-aligned sealing oxide layer to a top-most portion of the self-aligned sealing oxide layer.

7. The semiconductor structure of claim 6, further comprising:
   a second etch stop layer disposed between the first etch stop layer and the dielectric layer.

8. The semiconductor structure of claim 7, wherein the contact extends through the second etch stop layer.

9. The semiconductor structure of claim 6, further comprising:
   a cap layer between the conductive feature and the first etch stop layer, the cap layer being self-aligned with a top surface of the conductive feature.

10. The semiconductor structure of claim 6, further comprising a barrier layer over the sealing oxide layer.

11. The semiconductor structure of claim 10, wherein the barrier layer is conformed to the sealing oxide layer, exposed portions of the first etch stop layer, and a bottom of the contact trench.

12. The semiconductor structure of claim 6, wherein the sealing oxide layer includes radicals generated from the first etch stop layer.

13. The semiconductor structure of claim 12, wherein the sealing oxide layer includes oxidation of the radicals by oxygen containing bonds on the sidewall surfaces of the dielectric layer.

14. The semiconductor device of claim 12, wherein the radicals include aluminum containing radicals.

15. The semiconductor device of claim 14, wherein the sealing oxide layer includes aluminum oxide.

16. The semiconductor structure of claim 6, wherein the sealing oxide layer is disposed without contacting the first etch stop layer.

17. The semiconductor structure of claim 6, wherein the first etch stop layer is physically separated from the sealing oxide layer.

18. The semiconductor structure of claim 6, wherein the sealing oxide layer is spaced apart from a bottom of the contact trench.

19. A semiconductor structure, comprising:
- a substrate;
- a conductive feature disposed over the substrate;
- a first etch stop layer disposed over the conductive feature;
- a second etch stop layer disposed over the first etch stop layer;
- a dielectric layer disposed over the second etch stop layer;
- a contact formed within a contact trench in the dielectric layer and aligned with the conductive feature; and
- a sealing oxide layer that directly contacts the dielectric layer from a bottom-most portion of the self-aligned sealing oxide layer to a top-most portion of the self-aligned sealing oxide layer.

20. The semiconductor structure of claim 19, wherein the sealing oxide layer includes one of: titanium oxide and aluminum oxide.

* * * * *